United States Patent
Ishii (10) Patent No.: US 6,906,345 B2
(45) Date of Patent: Jun. 14, 2005

(54) SEMICONDUCTOR DEVICE AND METHOD OF MANUFACTURING THE SAME

(75) Inventor: Kazutoshi Ishii, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 10/422,961

(22) Filed: Apr. 24, 2003

(65) Prior Publication Data

US 2004/0058490 A1 Mar. 25, 2004

Related U.S. Application Data

(62) Division of application No. 09/997,825, filed on Nov. 30, 2001, now Pat. No. 6,596,593.

(30) Foreign Application Priority Data

| Dec. 5, 2000 | (JP) | 2000-370187 |
| Apr. 9, 2001 | (JP) | 2001-110383 |
| Apr. 26, 2001 | (JP) | 2001-129891 |

(51) Int. Cl.$^7$ .................. H01L 29/12; H01L 29/76
(52) U.S. Cl. ................................ 257/69; 257/342
(58) Field of Search .......................... 257/69, 342

(56) References Cited

U.S. PATENT DOCUMENTS

| 4,419,812 A | * 12/1983 | Topich | 438/238 |
| 5,712,173 A | * 1/1998 | Liu et al. | 438/297 |
| 5,939,754 A | * 8/1999 | Hoshi | 257/342 |

* cited by examiner

*Primary Examiner*—Alexander Ghyka
(74) *Attorney, Agent, or Firm*—Adams & Wilks (57) ABSTRACT

Disclosed is a semiconductor device having a reduced size, increased accuracy, and flattened element isolation regions with an decreased size. A plurality of MOSFETs having gate oxide films with different thicknesses and element isolation regions are formed by a manufacturing method employing oxygen implantation. An oxygen-ion implantation process and an annealing process are applied to a method of manufacturing the semiconductor device.

11 Claims, 10 Drawing Sheets

SEMICONDUCTOR DEVICE AND METHOD OF MANUFACTURING THE SAME

This application is a division of U.S. Ser. No. 09/997,825, filed Nov. 30, 2001, now U.S. Pat No. 6,596,593.

BACKGROUND OF THE INVENTION

1. Field of the Invention

The present invention relates to a field effect semiconductor device having a MOS structure and a method of manufacturing the same.

The present invention relates to a semiconductor device used in a semiconductor integrated circuit such as a voltage regulator, a switching regulator, or a voltage detector that is used for controlling a power supply voltage in a portable device or the like, and to a method of manufacturing the same. The present invention also relates to a semiconductor integrated circuit device into and from which plural levels of voltages are input and output, and to a method of manufacturing the same.

2. Description of the Related Art

Conventionally, plural power supply voltage levels are applied to or plural levels of output voltages are output from one semiconductor device. In such a case, it is necessary to form different semiconductor devices having different processes on one substrate. Hence, in such a semiconductor device, the device configuration and process flow are complicated and the number of elements to be controlled and the number of manufacturing steps increase. This has caused detrimental effects, such as, for example, increases in production turn around time (TAT) and in production cost.

It has been well-known that in order to eliminate such detrimental effects, a manufacturing method is employed in which a dual-gate is used, a channel stopper is applied to a high-voltage element, or the like.

This manufacturing method is described with reference to drawings as follows.

Figure 9:
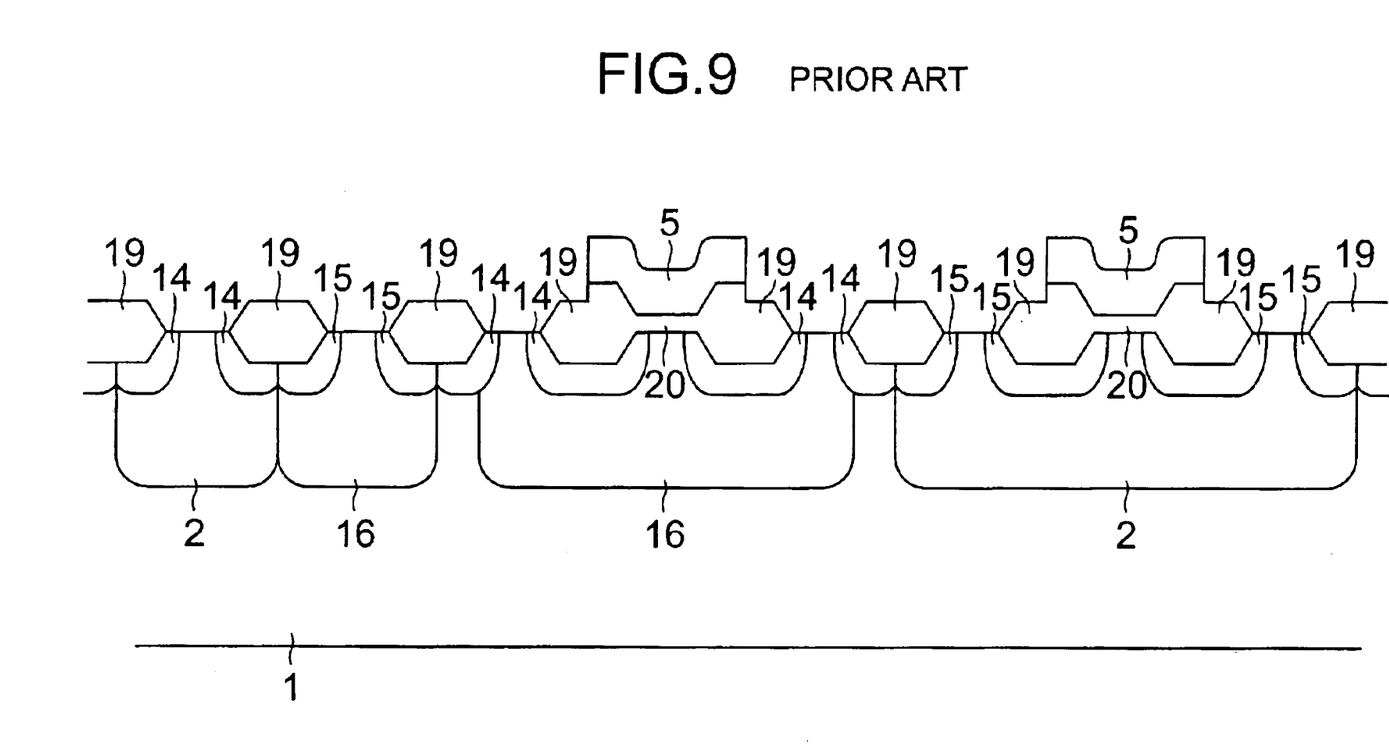
FIG. 9 is a schematic sectional view illustrating a method of manufacturing a conventional semiconductor device in the manufacturing step order.
Figure 10:
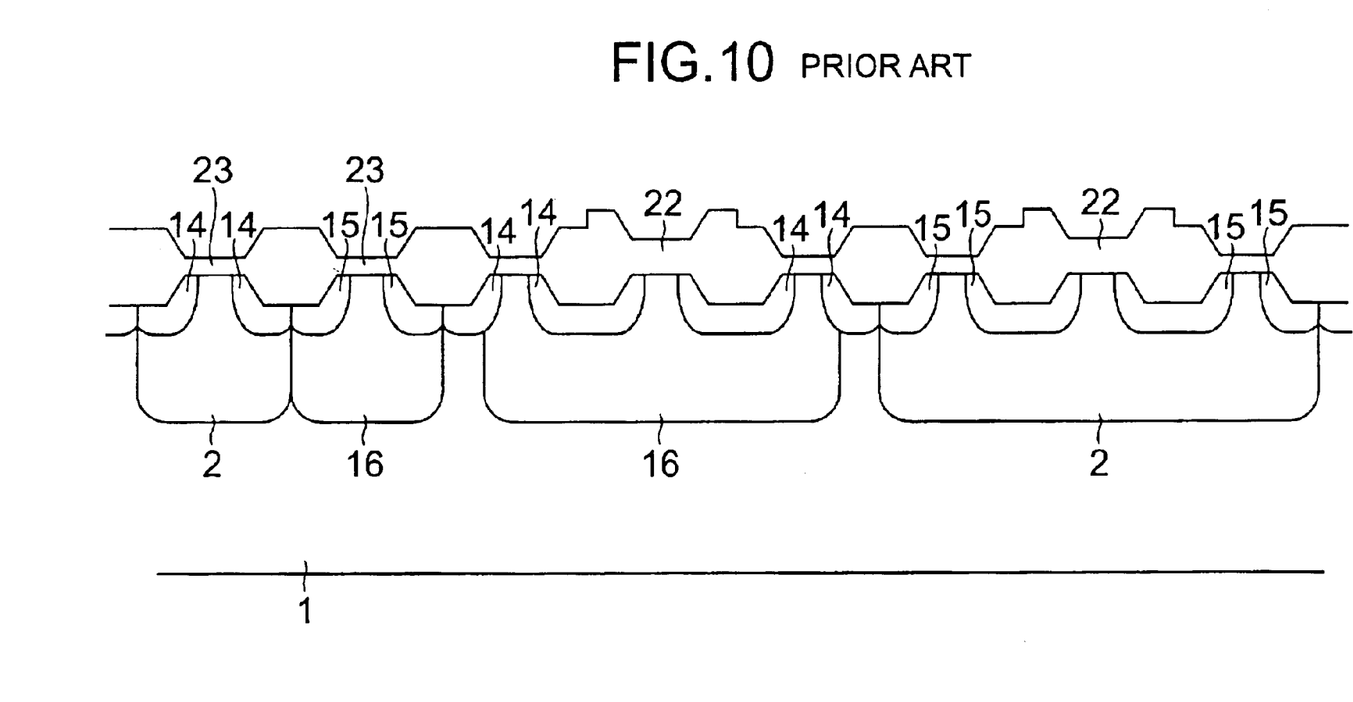
FIG. 10 is a schematic sectional view illustrating a method of manufacturing a conventional semiconductor device in the manufacturing step order.
Figure 11:
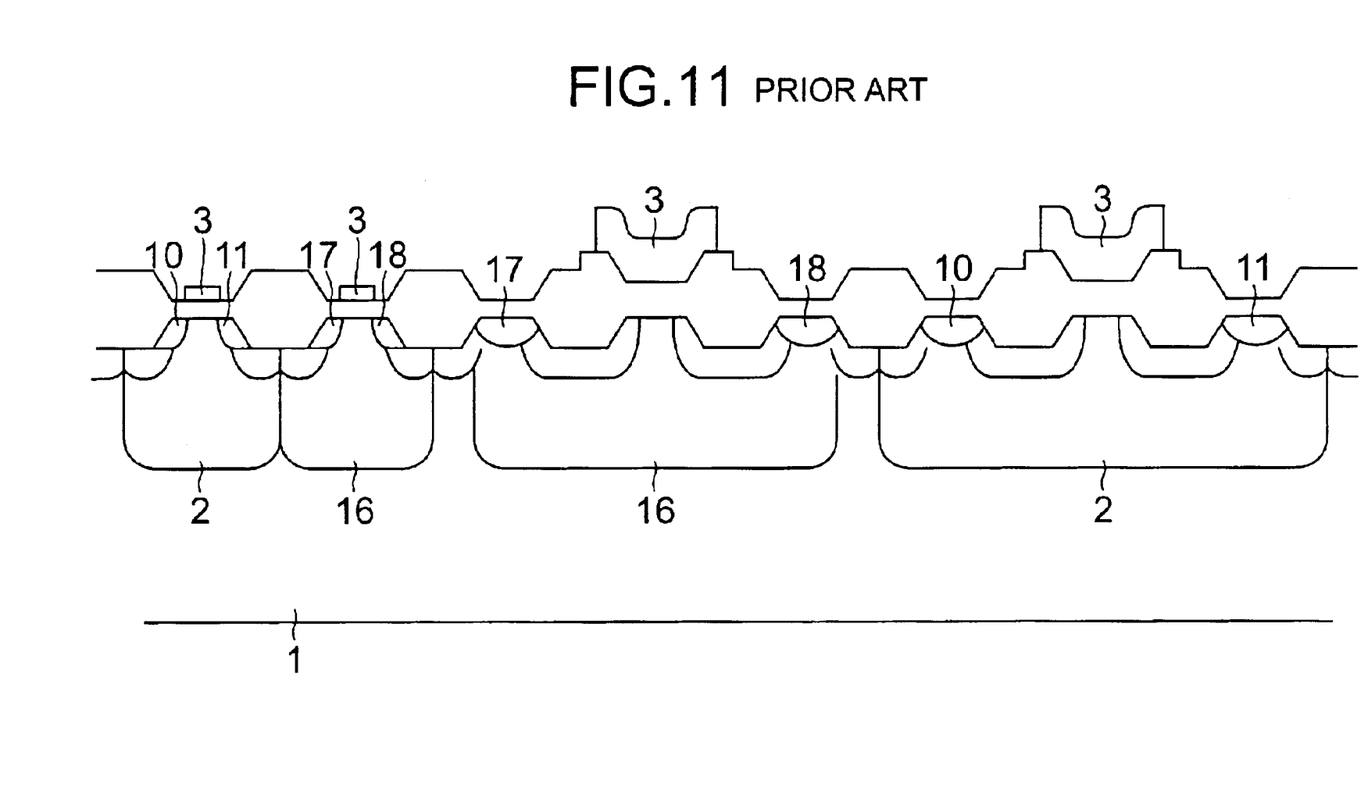
FIG. 11 is a schematic sectional view illustrating a method of manufacturing a conventional semiconductor device in the manufacturing step order.

FIGS. 9 to 11 are schematic sectional views illustrating a conventional method of manufacturing a semiconductor device in the manufacturing step order.

P wells 2 and N wells 16 are formed in the vicinity of the surface of a P-type semiconductor substrate 1 (hereinafter referred to as "Psub 1") by a photolithography process, an ion implantation process, and a thermal diffusion process. Afterward, thick oxide films 19 for element isolation, N-type channel stoppers 15, and P-type channel stoppers 14 are formed by a LOCOS method, an ion implantation process, a photo process, and the like. Thin oxide films 20 are formed by utilizing thermal oxidation. Photoresists 5 are formed on channel regions in regions to be high-voltage drive elements later, and the thin oxide films located in the other regions are removed by wet etching. Thus, the configuration shown in FIG. 9 is obtained.

Subsequently, the photoresists 5 are removed and then thick gate oxide films 22 for high voltage devices and thin gate oxide films 23 for low voltage devices are formed by utilizing thermal oxidation again. Thus, the configuration shown in FIG. 10 is obtained.

In this case, the thickness of the gate oxide films is set so that the electric field applied to the gate oxide films does not exceed 4 MV/cm.

Next, Poly-Si gates 3 are formed by a CVD process, a photo process, an etching process, and the like. For respective elements, an $N^+$ source 11, an $N^+$ drain 10, a $P^+$ source 18, and a $P^+$ drain 17 are formed by a photo process, an ion implantation process, and the like. Thus, the configuration shown in FIG. 11 is obtained.

Subsequent steps to be carried out are not shown in the drawings, but interlayer insulating films, contact holes, metal wirings, PADs for external connection, and a protective film are formed by ordinary semiconductor manufacturing processes. Thus, a conventional semiconductor device is completed.

In the conventional semiconductor device, however, the channel stoppers formed by the LOCOS method and the ion implantation process are used for the sources and drains in the low-voltage element. Hence, such a conventional semiconductor device had the following problem in structure.

As shown in FIGS. 9 to 11, the sources and drains formed by the LOCOS method and the ion implantation process are used for the high-voltage elements 23 and 24. Hence, there was a disadvantage in that the element size increases due to such a configuration.

Here, the LOCOS method and the ion implantation process are described. Generally, the LOCOS method is a manufacturing method including the steps of: forming nitride films with a high thermal-oxidation-resistant masking characteristic in regions to be active regions later by a photo process and an etching process; forming N-type and P-type impurity regions in regions to be N-type and P-type channel stoppers later, respectively, by a photo process and an ion implantation process; then forming thick oxide films for element isolation and N-type and P-type channel stoppers by thermal oxidation and thermal diffusion (for instance, a thermal oxidation and diffusion process at 1100° C. for about three hours); and forming element isolation regions and the active regions by removing the nitride film and oxide films over the active regions.

As described above, when the N-type and P-type channel stoppers formed by the above-mentioned LOCOS method and the like are used for the sources and drains of the elements for high voltage, reduction in element size is difficult due to such an element configuration. As shown in FIG. 11, the thick oxide films 19 that also serve as the element isolation regions are required to be provided on both sides of each thick gate oxide film 22 for high voltage. Consequently, it is difficult to prevent the size of the element including the channel, source, and drain regions from increasing.

Furthermore, in the conventional semiconductor device and the conventional method of manufacturing a semiconductor device, two types of gate oxide films are required in accordance with applied voltages, which leads to the following problem in manufacturing.

As shown in FIGS. 9 to 11, since the thermal oxidation process is carried out twice to form the thick gate oxide films 22 for high voltage, their thickness has great variation. The reason for this is described as follows. That is, generally, a hydrogen peroxide solution containing ammonia is used in a washing step carried out prior to the second thermal oxidation step, and this washing liquid etches and removes a part of the oxide film surface when the oxide film surfaces are washed with the liquid. Therefore, the etching amount differs depending on the state of the washing liquid and thus the base oxide films have variations in their thickness before the second thermal oxidation is carried out. As a result, the thick gate oxide films 22 for high voltage have great variations in their thickness. Such variations result in variations in threshold voltage and driving current value of the high-voltage elements, thus deteriorating characteristics of a semiconductor integrated circuit device, and making it difficult to increase accuracy in the characteristics of the semiconductor integrated circuit device.

SUMMARY OF THE INVENTION

In order to solve the above-mentioned problems, according to the present invention, the following means are adopted.

According to the present invention, there is provided a method of manufacturing an insulating-gate-type semiconductor device, the method comprising: a first step of forming a polycrystalline silicon gate in a vicinity of a surface of a P-type semiconductor substrate with a gate insulating film interposed between the polycrystalline silicon gate and the P-type semiconductor substrate; a second step of forming oxygen-ion implanted regions by implantation of oxygen ions into the polycrystalline silicon gate and a region in the vicinity of the surface of the P-type semiconductor substrate; a third step of forming oxide films by high-temperature annealing of the oxygen-ion implanted regions; a fourth step of forming N-type impurity regions through introduction of N-type impurities in a self-alignment manner with respect to a gate electrode formed of the polycrystalline silicon gate; and a fifth step of forming N-type high-concentration impurity regions through introduction of N-type impurities at a distance from the gate electrode.

According to the present invention, there is provided a method of manufacturing an insulating-gate-type semiconductor device wherein, in the first step of the above-mentioned method of manufacturing an insulating-gate-type semiconductor device, the device includes the steps of: forming a tungsten silicide film and an oxide film sequentially on the polycrystalline silicon gate; and forming the gate electrode through patterning of the polycrystalline silicon gate, the tungsten silicide film, and the oxide film using one mask.

According to the present invention, there is provided a method of manufacturing an insulating-gate-type semiconductor device wherein, in the second step of the above-mentioned manufacturing an insulating-gate-type semiconductor device, the method includes a step of forming an oxygen-ion implanted region inside the polycrystalline silicon gate in a vicinity of a gate oxide film formed of the gate insulating film.

According to the present invention, there is provided a method of manufacturing an insulating-gate-type semiconductor device wherein, in the second step of the above-mentioned manufacturing an insulating-gate-type semiconductor device, the method includes a step of forming oxygen-ion implanted regions in the vicinity of the surface of the P-type semiconductor substrate at a depth substantially equal to or deeper than a depth of junction location of the N-type impurity regions.

Further, according to the present invention, there is provided a method of manufacturing insulating-gate-type semiconductor device, comprising: a first step of forming a polycrystalline silicon gate in a vicinity of a surface of a P-type semiconductor substrate with a gate insulating film interposed between the polycrystalline silicon gate and the P-type semiconductor substrate; a second step of forming oxygen-ion implanted regions by implantation of oxygen ions into the P-type semiconductor substrate located under the polycrystalline silicon gate and the P-type semiconductor substrate located outside the polycrystalline silicon gate; a third step of forming oxide films by high-temperature annealing of the oxygen-ion implanted regions; a fourth step of forming N-type impurity regions through introduction of N-type impurities in a self-alignment manner with respect to a gate electrode formed of the polycrystalline silicon gate; and a fifth step of forming N-type high-concentration impurity regions through introduction of N-type impurities at a distance from the gate electrode.

According to the present invention, there is provided a method of manufacturing an insulating-gate-type semiconductor device wherein, in the first step of the above-mentioned manufacturing an insulating-gate-type semiconductor device, the method includes the steps of: forming a tungsten silicide film and an oxide film sequentially on the polycrystalline silicon gate; and forming the gate electrode through patterning of the polycrystalline silicon gate, the tungsten silicide film, and the oxide film using one mask.

According to the present invention, there is provided a method of manufacturing an insulating-gate-type semiconductor device wherein, in the second step of the above-mentioned manufacturing an insulating-gate-type semiconductor device, the method includes a step of forming the oxygen-ion implanted region inside the P-type semiconductor substrate in the vicinity of a gate oxide film formed of the gate insulating film.

According to the present invention, there is provided a method of manufacturing an insulating-gate-type semiconductor device wherein, in the second step of the above-mentioned manufacturing an insulating-gate-type semiconductor device, the method includes a step of forming oxygen-ion implanted regions in the vicinity of the surface of the P-type semiconductor substrate at a depth substantially equal to or deeper than a depth of junction location of the N-type impurity regions.

Further, according to the present invention, there is provided a semiconductor device including MOSFETs with a plurality of gate oxide films forming a semiconductor integrated circuit device driven with plural levels of power supply voltages, the device comprising: a first polycrystalline silicon gate formed with a thick gate oxide film interposed between the first polycrystalline silicon gate and a P-type semiconductor substrate; oxide films provided in the P-type semiconductor substrate, the oxide films being located outside both side ends of the first polycrystalline silicon gate; N-type impurity regions provided on the oxide films; a second polycrystalline silicon gate formed with a thin gate oxide film interposed between the second polycrystalline silicon gate and the P-type semiconductor substrate; and N-type impurity regions provided in a vicinity of a surface of the P-type semiconductor substrate, the N-type impurity regions being located outside both side ends of the second polycrystalline silicon gate.

According to the present invention, there is provided a semiconductor device wherein, in the MOSFETs, the device includes the thick gate oxide film provided in a convex form protruding toward the P-type semiconductor substrate in the vicinity of the surface of the P-type semiconductor substrate.

Further, according to the present invention, there is provided a method of manufacturing an insulating-gate-type semiconductor device, comprising: a first step of forming an oxygen-ion implanted region selectively in a vicinity of a surface of a P-type semiconductor substrate through an oxide film; and a second step of forming an oxide film for element isolation by high-temperature annealing of the oxygen-ion implanted region.

According to the present invention, there is provided a semiconductor device wherein, in MOSFETs with different conduction types of a semiconductor integrated circuit device, the device includes: gate electrodes provided in a vicinity of a P well surface and a vicinity of an N well surface, respectively, in a vicinity of a surface of a P-type semiconductor substrate with a gate oxide film interposed between the P-type semiconductor substrate and the gate electrodes; oxide films for element isolation provided in element isolation regions extending from an inside of the P-type semiconductor substrate to a region in the vicinity of the surface of the P-type semiconductor substrate; N-type impurity regions provided in the vicinity of the P well surface in a self-alignment manner with respect to the gate electrode and the oxide films for element isolation; and P-type impurity regions provided in the vicinity of the N well surface in a self-alignment manner with respect to the gate electrode and the oxide films for element isolation.

DETAILED DESCRIPTION OF THE PREFERRED EMBODIMENTS

As described above, in the present invention, an oxygen ion implantation process and an annealing process are applied to a method of manufacturing a semiconductor device. This promotes the reduction in size and the increase in accuracy of a high-voltage element.

An embodiment of the present invention is described with reference to the drawings as follows.

Figure 1:
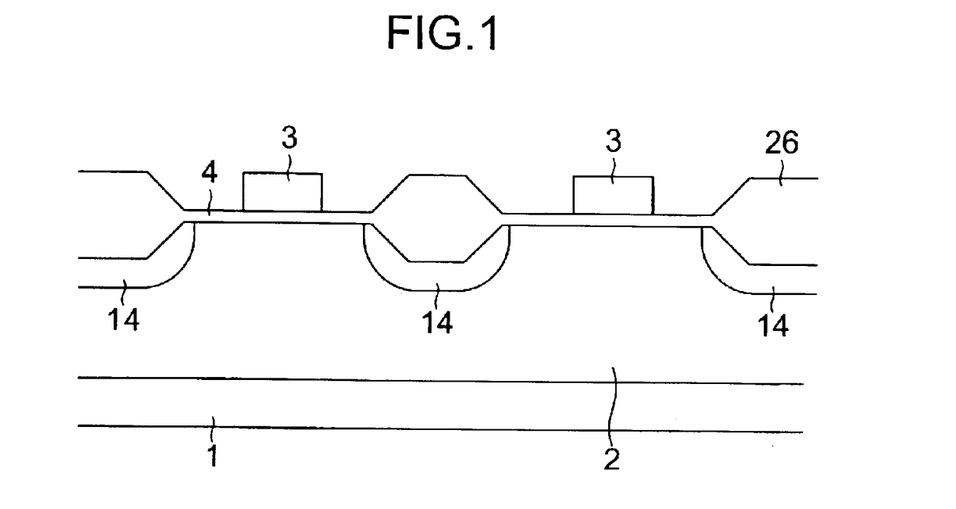
FIG. 1 is a schematic sectional view illustrating a method of manufacturing a semiconductor device in accordance with the present invention in the manufacturing step order.

This embodiment is directed to the case where the present invention is used for an N-type MOSFET device for high voltage and an N-type MOSFET device for low voltage that are formed on one semiconductor substrate. FIG. 1 shows a manufacturing method of the present embodiment. First, as shown in FIGS. 1 to 4, a P well 2, thick oxide films 19 for element isolation, and gate electrodes 3 made of polycrystalline silicon are provided on a Psub 1 using a conventional method of manufacturing an integrated circuit.

The detailed manufacturing method is described as follows. Boron ions are implanted into the vicinity of the Psub 1 surface, and then annealing is carried out at 1000 to 1175° C. for 3 to 20 hours to diffuse and redistribute the boron ions. Thus, the P well 2 having an impurity concentration of about $1E16$ cm$^{-3}$ is formed. Subsequently, B$^+$ ions are implanted into regions patterned with a nitride film or the like, and P-type channel stoppers 14 and field insulating films 26 are formed by a LOCOS method.

Afterward, for threshold voltage control, ion implantation is carried out with respect to a desired channel region, a gate oxide film 4 with a thickness of 10 to 30 nm is formed by a thermal oxidation method, a polysilicon film with a thickness of 100 to 500 nm is formed by a low pressure chemical vapor deposition (low pressure CVD) method or the like, and a polysilicon film is formed by ion implantation or the like. In some cases, a tungsten silicide film with a thickness of about 100 to 200 nm may be formed on the polysilicon film by sputtering method or the like and an oxide film with a thickness of about 100 to 300 nm may be formed thereon by the low pressure CVD method or the like. Then, the polysilicon film is patterned to form the Poly-Si gates 3. Here, an oxide film with a thickness of about 10 to 50 nm may be formed, for example, on the upper and side wall portions of the gate electrodes 3 and the surface portion of the semiconductor substrate, using the thermal oxidation method, the low pressure CVD method, or the like in some cases. With the steps described above, the configuration shown in FIG. 1 is obtained.

Figure 2:
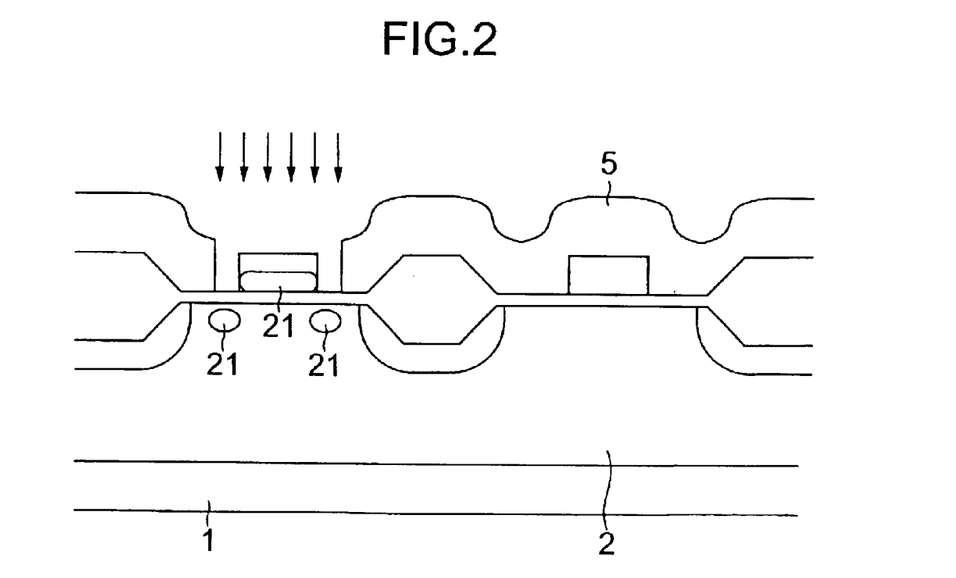
FIG. 2 is a schematic sectional view illustrating a method of manufacturing a semiconductor device in accordance with the present invention in the manufacturing step order.

Afterward, as shown in FIG. 2, oxygen ions (O-ions) are implanted selectively, using a photoresist 5, into a region of the Poly-Si gate 3 in the vicinity of the gate oxide film 4 inside the region to be a high-voltage element and into regions of the P well 2 located outside both side ends of the Poly-Si gate 3, and thus O-ion implanted regions 21 are formed. Accelerating energy for the oxygen ion implantation in this case is set to allow the oxygen ion concentration to peak in the region of the Poly-Si gate 3 in the vicinity of the gate oxide film 4. In addition, it is desirable that the film thickness of the Poly-Si gate 3 be set so that the depth of the O-ion implanted regions 21 in the P well 2 that is measured from the vicinity of the P well 2 surface is approximately equal to or deeper than the junction depth of an N$^-$ region 6 to be formed later that is measured from the vicinity of the P well 2 surface.

Subsequently, an annealing step is carried out at a high temperature. In this step, the O-ion implanted region 21 in the Poly-Si gate 3 and the gate oxide film 4 become one oxide film by the annealing treatment to form a thick oxide film 20, and the O-ion implanted regions 21 in the P well 2 become oxide films to form oxide films 7 embedded in the P well 2.

On the other hand, no new oxide film is formed in the low-voltage element region where the oxygen ions have not been implanted.

Figure 3:
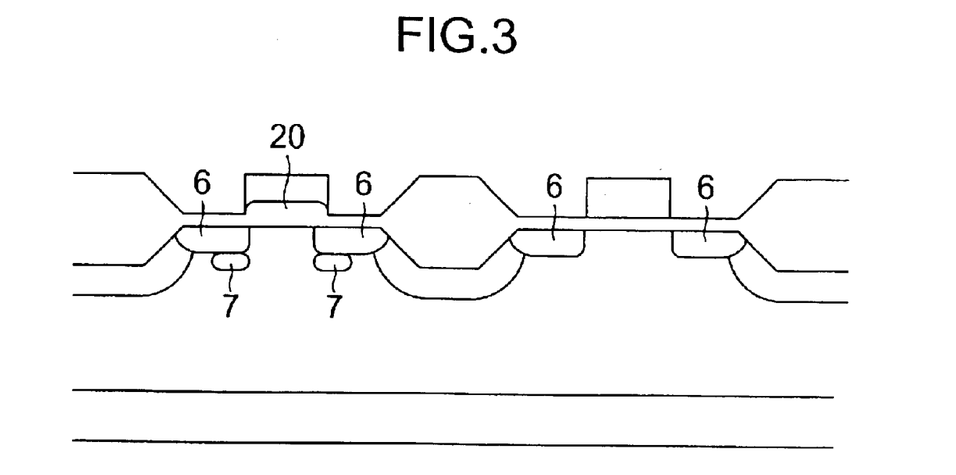
FIG. 3 is a schematic sectional view illustrating a method of manufacturing a semiconductor device in accordance with the present invention in the manufacturing step order.

Next, N-type impurities are ion-implanted in a self-alignment manner with respect to the Poly-Si gate 3 and thereby N⁻ regions 6 are formed so as to be shallower than the depth with which the oxide films 7 are formed. Simultaneously, N⁻ regions 6 also are formed in the low-voltage element region. Here, it is also possible to make the high-voltage element and the low-voltage element have different impurity concentrations in their respective N⁻ regions 6 using different masks. Thus, the configuration shown in FIG. 3 is obtained.

Figure 4:
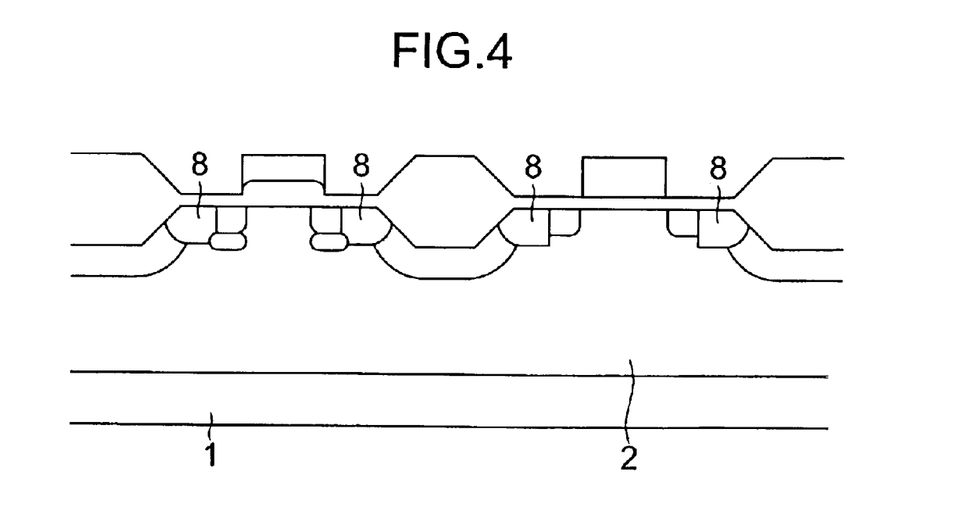
FIG. 4 is a schematic sectional view illustrating a method of manufacturing a semiconductor device in accordance with the present invention in the manufacturing step order.

Next, N⁺ regions 8 are formed by the ion implantation of N-type impurities at a high impurity concentration. The N⁺ regions 8 are formed in both the high-voltage and low-voltage elements at the same time. In both the impurity regions, the impurity concentration is set to be about 1E21 cm⁻³. Thus, the configuration shown in FIG. 4 is obtained.

Finally, a phosphorus glass layer is formed as an interlayer insulator, which is not shown in the figure, as in the case of manufacturing a conventional integrated circuit. For example, the low pressure CVD method may be used for the formation of the phosphorus glass layer. Material gas is obtained using mono-silane $SiH_4$, oxygen $O_2$, and phosphine $PH_3$ through reaction among them at 450° C.

Afterward, holes for forming an electrode are made in the interlayer insulating film and then aluminum electrodes are formed. Thus, the high-voltage N-type MOSFET device and the low-voltage N-type MOSFET device are completed on one semiconductor substrate.

Figure 5:
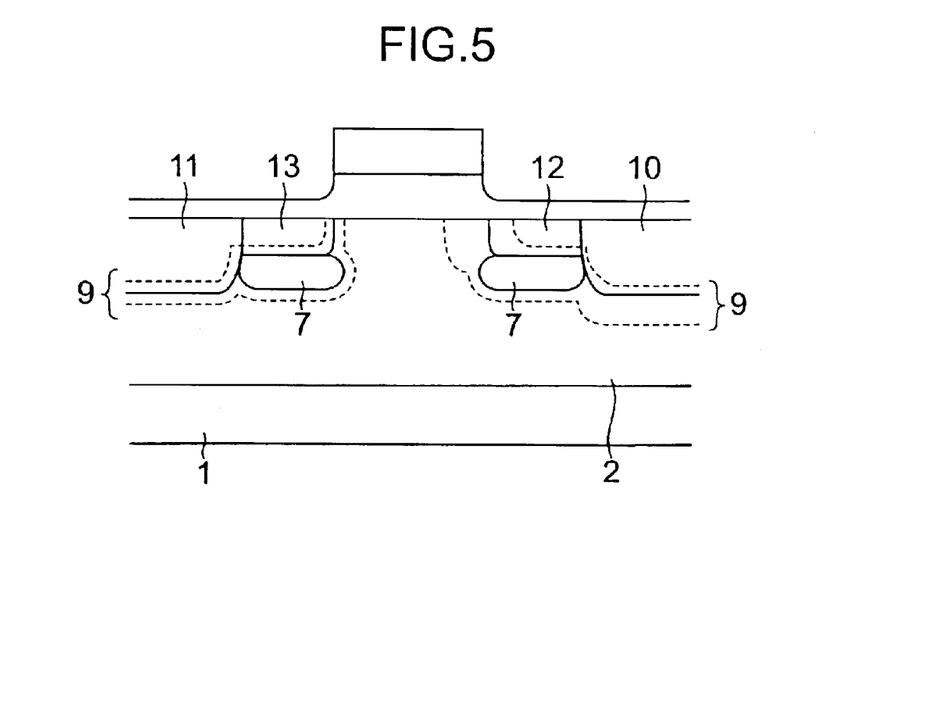
FIG. 5 is a schematic sectional view illustrating a semiconductor device in accordance with the present invention.

FIG. 5 is a sectional view of the semiconductor device of the embodiment of the present invention. The device has a P type semiconductor substrate 1, a P type well 2 on the substrate 1, N⁺ drain and N⁺ source separated from each other on the surface of the P type well 2, N⁻ drain 10 and N⁻ source 13 separated from each other on the side of the N⁺ drain 10 and N⁺ source 11 on the surface of the P type well, and a pair of oxides 7 under the N⁻ drain 12 and N⁻ source 13. In the semiconductor device thus obtained, the oxide films 7 are embedded under the N⁻ drain region 12 of the high-voltage element. Hence, in the N⁻ drain regions 12 used as drains, a short-channel effect that hinders higher-voltage drive and reduction in channel length of a transistor is suppressed since a depletion layer 9 is not expanded downward even when high voltage is applied to the drains. Consequently, a small high-voltage drive element can be obtained.

When the oxygen-ion implantation step is carried out with increased accuracy, a thick gate oxide film with less variation in film thickness can be formed even when using a dual-gate. Hence, the accuracy of the semiconductor device can be improved.

Figure 6:
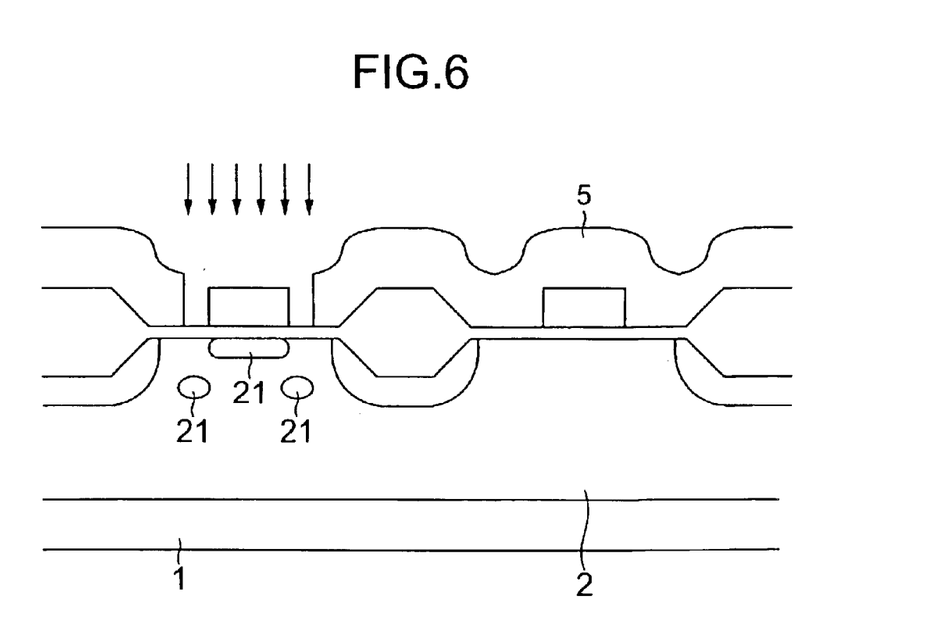
FIG. 6 is a schematic sectional view illustrating a method of manufacturing a semiconductor device in accordance with the present invention in the manufacturing step order.
Figure 7:
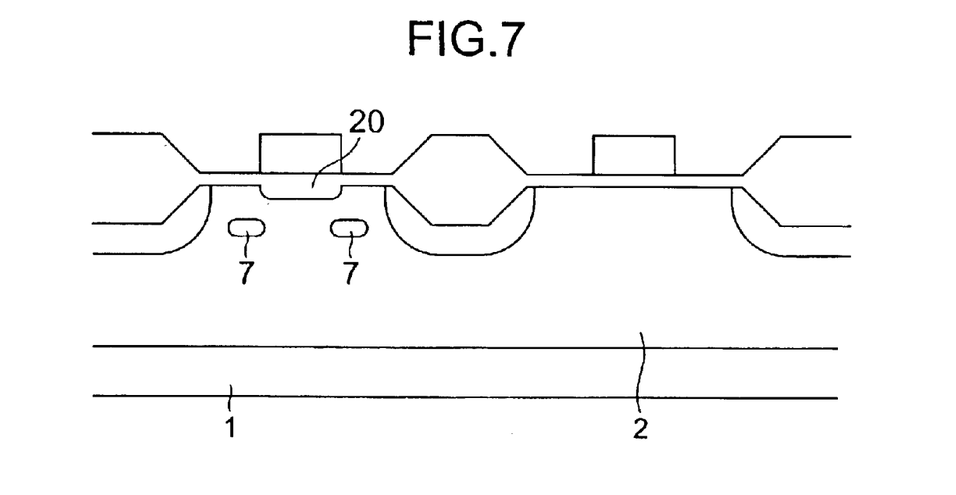
FIG. 7 is a schematic sectional view illustrating a method of manufacturing a semiconductor device in accordance with the present invention in the manufacturing step order.
Figure 8:
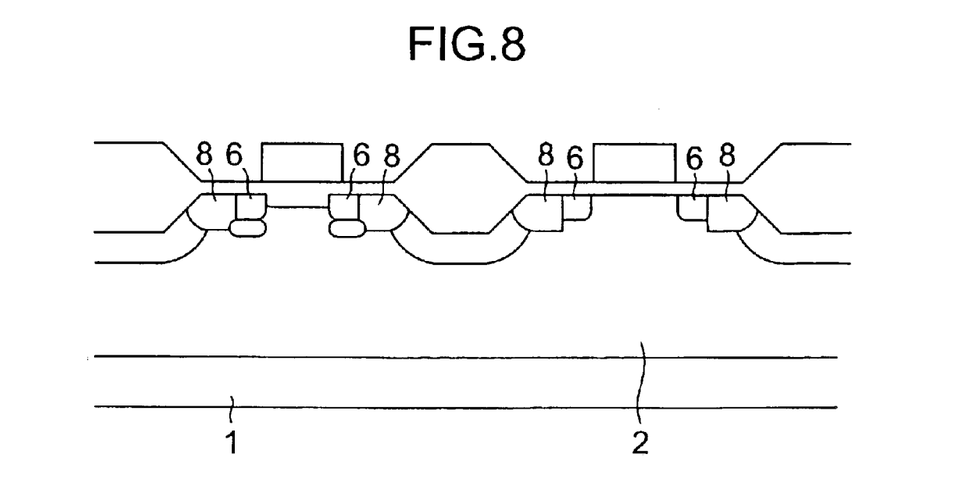
FIG. 8 is a schematic sectional view illustrating a method of manufacturing a semiconductor device in accordance with the present invention in the manufacturing step order.

FIGS. 6 to 8 are sectional views sequentially illustrating steps for manufacturing a semiconductor device in the case where an oxygen-ion implantation position is set so as to be in the vicinity of a gate oxide film 4 in a P well 2.

In this case, a semiconductor device of the present invention can be formed using the same steps as those described with reference to FIGS. 1 to 4. With respect to the setting of oxygen-ion implantation energy, however, it is necessary to set it so that the oxygen ion concentration peaks in the vicinity of the gate oxide film 4 in the P well 2.

The present invention has been described as applied to the N-type MOSFET devices. However, a P-type MOSFET device also can be formed by a similar manufacturing method in which the conduction types are reversed.

Furthermore, a complementary MOSFET device (CMOS device) also can be formed by a combination of the method of manufacturing an N-type MOSFET device and that of manufacturing a P-type MOSFET device.

In the present invention, the oxygen-ion implantation process and an annealing process are applied to the method of manufacturing a semiconductor device. In the above, the decrease in size and the increase in accuracy of a high-voltage element have been described. The following description is directed to an embodiment in which the present invention is applied in relation to element isolation.

An embodiment of the present invention is described with reference to the drawings as follows.

Figure 12:
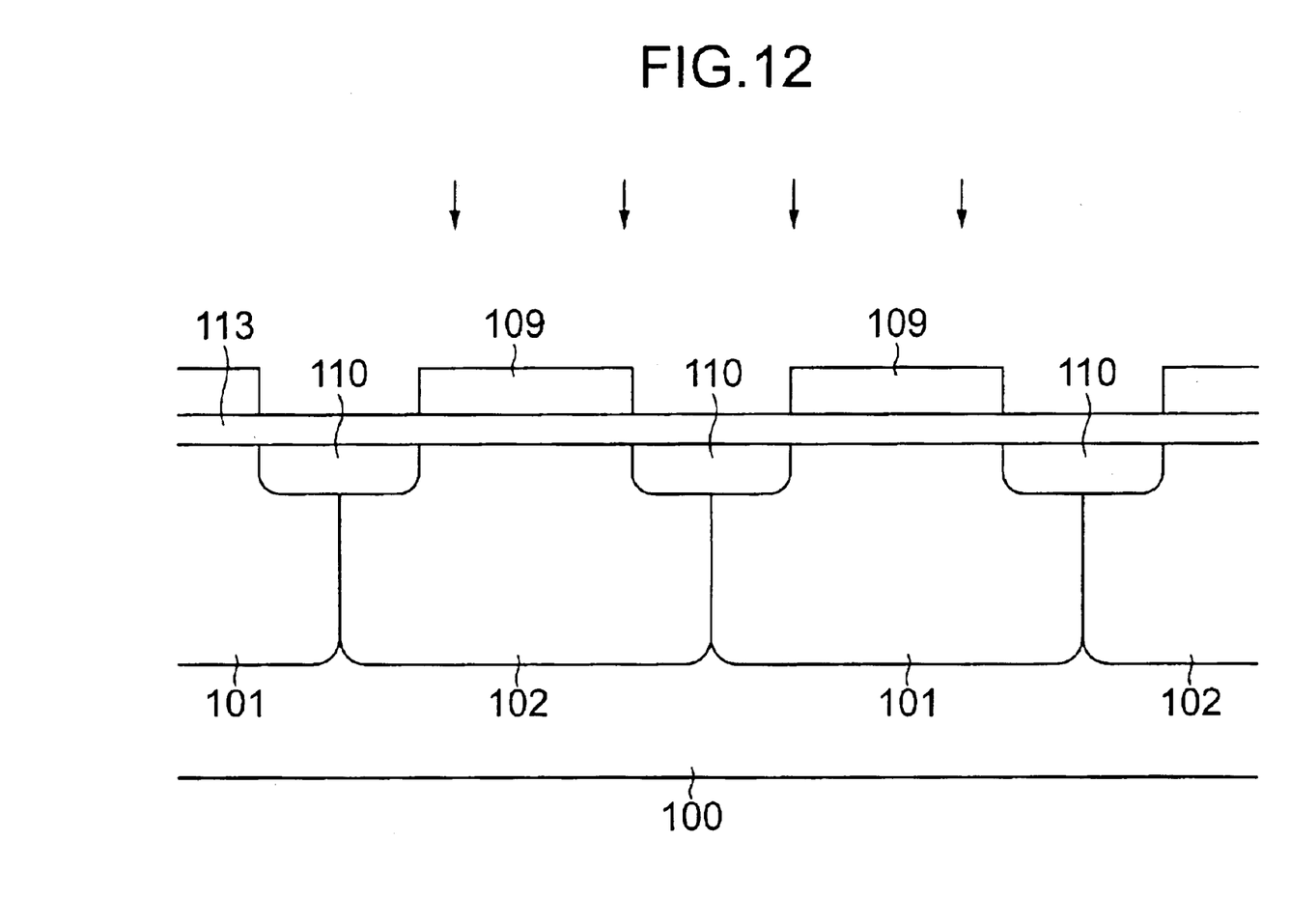
FIG. 12 is a schematic sectional view illustrating a method of manufacturing a semiconductor device in accordance with the present invention in the manufacturing step order.
Figure 13:
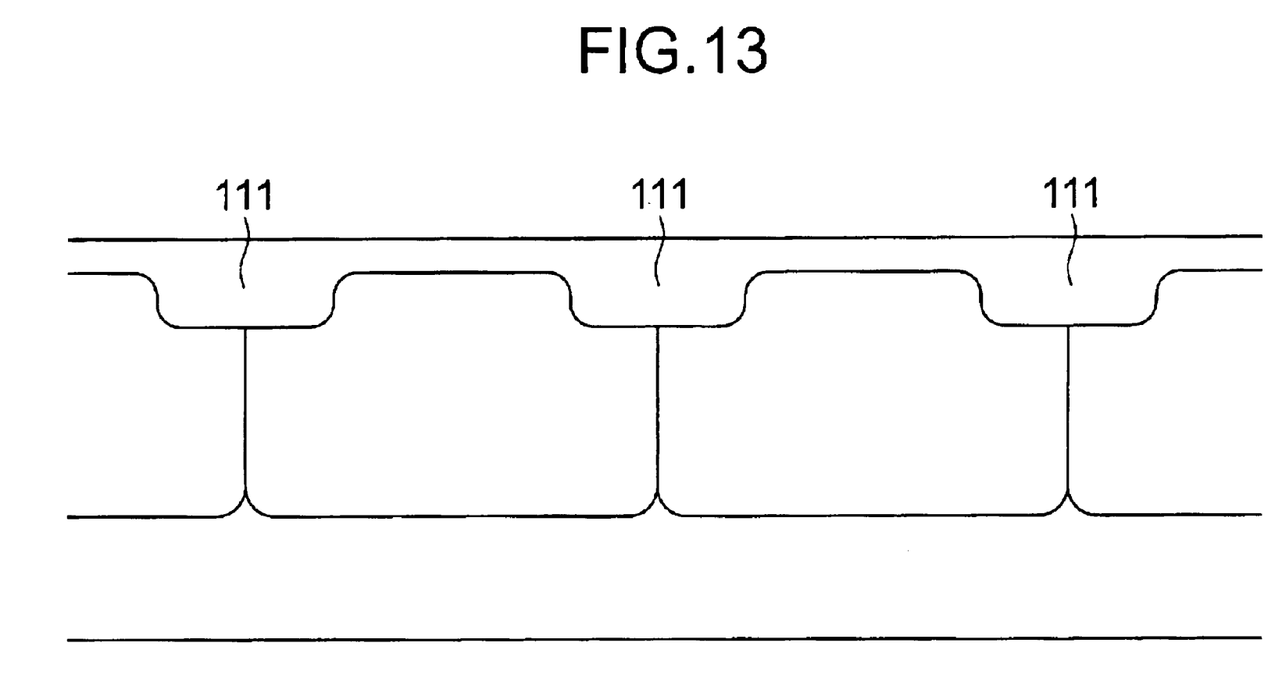
FIG. 13 is a schematic sectional view illustrating a method of manufacturing a semiconductor device in accordance with the present invention in the manufacturing step order.
Figure 14:
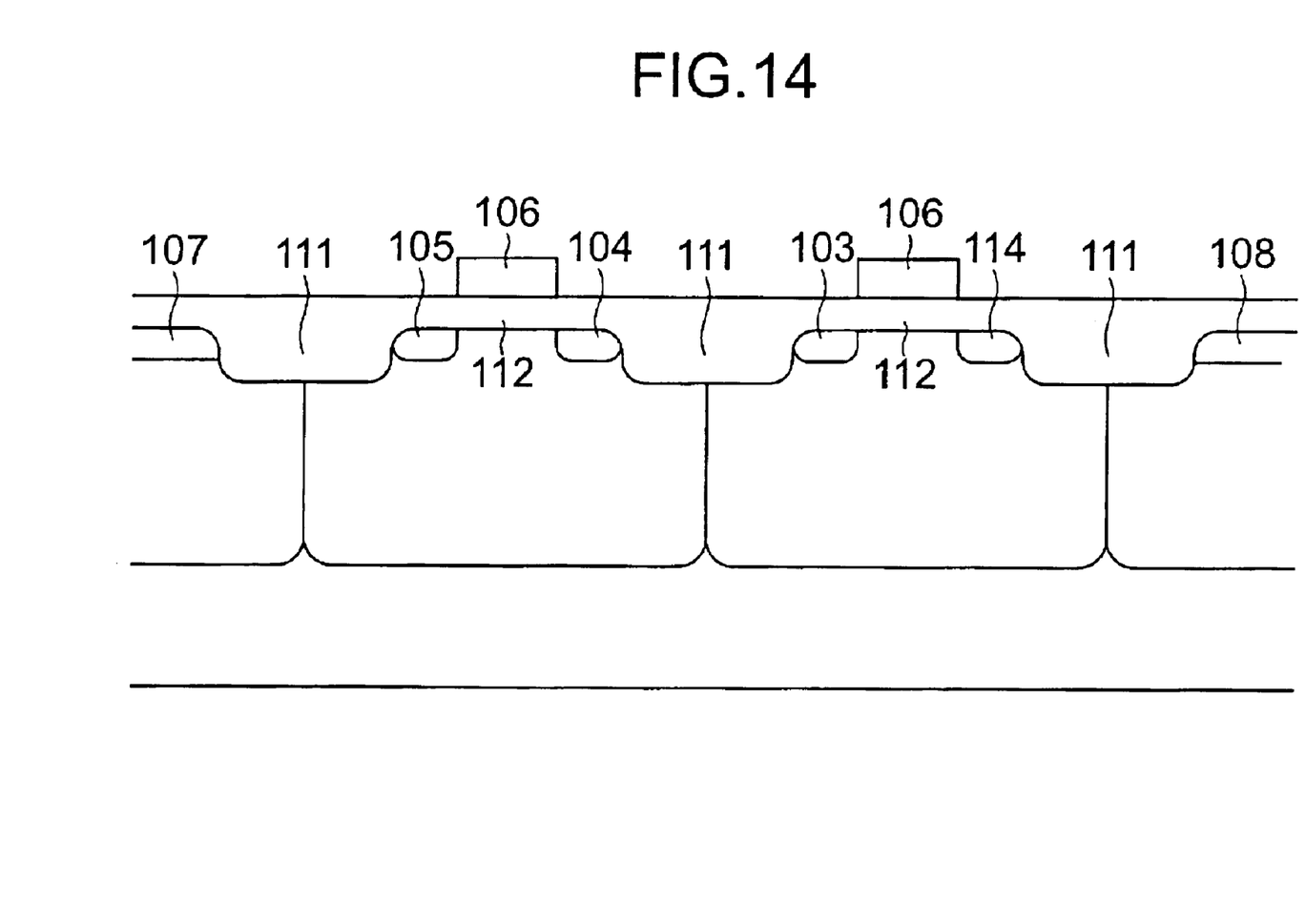
FIG. 14 is a schematic sectional view illustrating a method of manufacturing a semiconductor device in accordance with the present invention in the manufacturing step order.

This example shows the case where the present invention is applied to an N-type MOSFET device and a P-type MOSFET device that are formed on one semiconductor substrate, and an isolation element for isolating them from each other. A manufacturing method according to the present embodiment is shown in FIGS. 12 to 14. First, as shown in FIG. 12, P wells 101 and N wells 102 are provided on a P-type semiconductor substrate 100 by using a conventional method of manufacturing an integrated circuit.

The detailed manufacturing method is described as follows. Boron ions and phosphorus ions are implanted selectively into the vicinity of the surface of the P-type semiconductor substrate 100, and annealing is carried out at 1000 to 1175° C. for 3 to 20 hours to diffuse and redistribute the boron ions and the phosphorus ions. Thus, the P wells 101 and the N wells 102 having an impurity concentration of about 1E16 cm⁻³ are formed. In addition, an implantation oxide film 113 is formed in the vicinity of the semiconductor substrate 100 surface.

Afterward, oxygen ions (O-ions) are implanted selectively into regions in the vicinity of the surfaces of the P wells 101 and N wells 102 that are to be oxide films 111 for element isolation later, using photo resists 109. Thus, O-ion implanted regions 110 are formed. Accelerating energy for the oxygen ion implantation in this case is set so as to allow the oxygen ion concentration to peak in the regions in the vicinity of the P wells 101 and N wells 102 surfaces. In this case, it is desirable that the O-ion implanted regions 110 be set so that most part (about 3 sigma) of the O ions is present in the P wells 101 and N wells 102.

Afterward, as shown in FIG. 13, the annealing step is carried out at a high temperature. In this step, the implantation oxide film 113 and the O-ion implanted regions 110 in the P wells 101 and N wells 102 become a single oxide film by the annealing treatment. Thus, the O-ion implanted regions 110 in the P wells 101 and the N wells 102 become the oxide film, and thereby the oxide film 111 for element isolation is formed that is embedded in the surface portions of the P wells 101 and N wells 102.

On the other hand, no new oxide film is formed in the regions covered with the photoresists 109 where the oxygen ions have not been implanted.

Next, as shown in FIG. 14, the following steps are carried out. That is, ion implantation into desired channel regions is carried out for threshold voltage control; a gate oxide film 112 with a thickness of 10 to 30 nm is formed by the thermal oxidation method after the implant at ion oxide film 113 is removed; a polysilicon film with a thickness of 100 to 500 nm is formed by the low pressure CVD method, or the like; and a polysilicon film with a high impurity concentration is formed by ion implantation or the like. In some cases, a tungsten silicide film with a thickness of about 100 to 200 nm may be formed on the polysilicon film with a high impurity concentration by sputtering method or the like, and an oxide film with a thickness of about 100 to 300 nm may be formed on the tungsten silicide film by the low pressure CVD method or the like. The polysilicon film is patterned to form gate electrodes 106. In some cases, an oxide film with a thickness of about 10 to 50 nm may be formed, for example, on upper and side wall portions of the gate electrodes 106 and the surface portion of the semiconductor substrate, by the thermal oxidation method, the low pressure CVD method, or the like. Afterward, ion implantation is carried out in a self-alignment manner with respect to the gate electrodes 106, the oxide films 111 for element isolation, and the photoresists, and thereby a $P^+$ source region 105, a $P^+$ drain region 104, a $P^+$ channel stopper 107, an $N^+$ source region 103, an $N^+$ drain region 114, and an $N^+$ channel stopper 108 are formed selectively. With the steps described above, the configuration shown in FIG. 14 is obtained.

Thus, in a semiconductor device including an N-type MOSFET device and a P-type MOSFET device that are formed on one semiconductor substrate and isolation elements for isolating respective elements from each other, the reduction in size of the element isolation regions can be achieved easily since the element isolation is not carried out by the LOCOS method that generally has been employed conventionally.

The LOCOS method is a manufacturing method including the steps of: selectively forming an $Si_3N_4$ film or the like that is excellent in oxidation resistance on a base oxide film; carrying out thermal oxidation thereof at a high temperature of about 1000 to 1100° C.; then removing the oxidation-resistant film; and thereby forming oxide film regions for element isolation and active regions. In this case, however, regions called "bird's beak" whose thickness is reduced smoothly in the end portions of the oxide films for element isolation are formed due to oxygen getting into the regions. This was a hindrance to reduction in the size of the element isolation regions.

In the present invention, however, oxygen that is utilized to form the oxide films for element isolation later can be supplied by ion implantation and thus the oxidation of the active regions due to the oxygen getting thereinto is not caused. Hence, the active regions and the element isolation regions are divided abruptly. Thus, the size of the element isolation regions can be reduced easily.

The steeply stepped portions basically cause inconvenience in flattening of a wiring layer and an interlayer film that are to be formed subsequently. In the present invention, however, since the steeply stepped portions are embedded in the semiconductor substrate, no stepped portion hindering the subsequent manufacturing steps is produced in the upper portion. Hence, in the subsequent steps, the number of steps for flattening is not increased.

The steps carried out after the step shown in FIG. 14 are not shown in the drawings but include the steps of: forming the interlayer film on the surface portion; forming contact regions; forming metal wirings; forming a protective film; and making windows for electrical connection. Thus, the semiconductor device of the present invention is completed.

The present invention allows a MOSFET that is excellent in cost performance to be manufactured. Particularly, the present invention provides a method that is effective for diversification of working power supply voltage, high voltage driving, flattening and reduction in size of the element isolation regions, and the like, which are considered to be developed from now on.

The description of the present invention is mainly directed to a silicon-based semiconductor device. However, it is apparent that the present invention also can be applied to semiconductor devices obtained using other materials such as germanium, silicon carbide, gallium arsenide, etc. Furthermore, in the present invention, the reduction in resistance of the gate electrodes also plays an important role. Besides the material used for the silicon gates mentioned mainly in the description of the present invention, for example, materials with which an oxide film can be formed by oxygen ion implantation and annealing also can be used for the gate electrodes. In addition, while the embodiment of the present invention are directed to the steps of manufacturing NMOSFETs on a P-type semiconductor substrate, it is apparent that the present invention can also be applied to the manufacture of thin film transistors (TFTs) utilizing a polycrystalline or monocrystalline semiconductor coating film formed on an insulating substrate formed of quartz, sapphire, or the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all modifications, which come within the meaning and range of equivalency of the claims, are intended to be embraced therein.

What is claimed is:

1. A semiconductor integrated circuit device comprising:
   one or more first MOSFETs driven by a first power supply voltage, each first MOSFET comprising a semiconductor substrate, a first gate oxide film formed on the semiconductor substrate, a first polycrystalline silicon gate electrode formed over the first gate oxide film, buried oxide films buried in the semiconductor substrate on opposite sides of the first polycrystalline silicon gate electrode, and first source and drain regions formed in the semiconductor substrate directly over the buried oxide films; and
   one or more second MOSFETs driven by a second power supply voltage lower than the first power supply voltage, each second MOSFET comprising a second gate oxide film formed on the semiconductor substrate and having a smaller thickness than the first gate oxide film, a second polycrystalline silicon gate electrode formed on the second gate oxide film, and second source and drain regions provided in the semiconductor substrate on opposite sides of the second polycrystalline silicon gate electrode.

2. A semiconductor integrated circuit device according to claim 1; wherein the first gate oxide film has a convex portion protruding into one of the semiconductor substrate and the first polycrystalline silicon gate electrode in a region directly below the first polycrystalline silicon gate electrode.

3. A semiconductor integrated circuit device according to claim 1; wherein the semiconductor substrate is a P-type semiconductor substrate and the first and second source and drain regions are N-type source and drain regions.

4. A semiconductor integrated circuit device according to claim 1; further comprising a buried oxide film formed within the first polycrystalline silicon gate electrode.

5. A semiconductor integrated circuit device according to claim 4; wherein the buried oxide films comprise oxygen-ion implanted regions formed by implanting oxygen ions in the first polycrystalline silicon gate electrode and the semiconductor substrate, and annealing the ion implanted regions at a high temperature.

6. A semiconductor integrated circuit device according to claim 1; further comprising a tungsten silicide film provided on at least one of the first and second polycrystalline silicon gate electrodes.

7. A semiconductor integrated circuit device according to claim 1; further comprising a buried oxide film formed in the semiconductor substrate directly beneath the first polycrystalline silicon gate electrode and between the first source and drain regions.

8. A semiconductor integrated circuit device according to claim 7; wherein the buried oxide films comprise oxygen-ion implanted regions formed by implanting oxygen ions in the first polycrystalline silicon gate electrode and the semiconductor substrate, and annealing the ion implanted regions at a high temperature.

9. A semiconductor integrated circuit device according to claim 1; wherein the buried oxide films comprise oxygen ions implanted into the semiconductor substrate using the first polycrystalline silicon gate electrode as a mask.

10. A semiconductor integrated circuit device according to claim 1; wherein the first source and drain regions comprise low impurity concentration regions formed in the semiconductor substrate on opposite sides of the first polycrystalline silicon gate electrode and high impurity concentration regions formed in the semiconductor substrate on opposite sides of the low impurity concentration regions.

11. A semiconductor integrated circuit device according to claim 10; wherein the buried oxide films are formed under the low impurity concentration regions.

* * * * *